United States Patent
Kimura

(10) Patent No.: US 9,473,072 B2
(45) Date of Patent: Oct. 18, 2016

(54) AMPLIFICATION DEVICE AND AMPLIFICATION METHOD

(71) Applicant: FUJITSU LIMITED, Kawasaki-shi, Kanagawa (JP)

(72) Inventor: Shigekazu Kimura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/611,049

(22) Filed: Jan. 30, 2015

(65) Prior Publication Data

US 2015/0222233 A1 Aug. 6, 2015

(30) Foreign Application Priority Data

Feb. 3, 2014 (JP) ................................. 2014-018788

(51) Int. Cl.
| | |
|---|---|
| H03F 1/02 | (2006.01) |
| H03F 3/04 | (2006.01) |
| H03F 3/68 | (2006.01) |
| H03F 3/24 | (2006.01) |
| H03F 3/60 | (2006.01) |

(52) U.S. Cl.
CPC .......... H03F 1/0205 (2013.01); H03F 1/0294 (2013.01); H03F 3/245 (2013.01); H03F 3/604 (2013.01); *H03F 2200/204* (2013.01); *H03F 2200/207* (2013.01); *H03F 2200/78* (2013.01)

(58) Field of Classification Search
USPC .......................... 330/124 R, 295, 84, 286, 53
See application file for complete search history.

(56) References Cited

U.S. PATENT DOCUMENTS 7,427,895 B1* 9/2008 Okubo .................... H03F 3/602
330/124 R

FOREIGN PATENT DOCUMENTS

| | | |
|---|---|---|
| JP | 2002-510927 A | 4/2002 |
| JP | 2007-174148 A | 7/2007 |
| JP | 2009-545250 A | 12/2009 |
| JP | 2013-046352 A | 3/2013 |
| WO | WO 99/52206 A1 | 10/1999 |
| WO | WO 2008/014210 A1 | 1/2008 |

* cited by examiner

*Primary Examiner* — Hieu Nguyen
(74) *Attorney, Agent, or Firm* — Arent Fox LLP

(57) ABSTRACT

An amplification device includes: a first circuit configured to: split an input signal into a first signal and a second signal, and adjust the first signal so that an amplitude of the first signal is less than an amplitude of the second signal by a reduced value, a first amplifier configured to amplify the adjusted first signal, a second amplifier configured to amplify the second signal, and a second circuit configured to: determine a reflection coefficient in case where the amplified second signal is a travelling wave and the amplified first signal is a reflected wave, and determine the reduced value based on the reflection coefficient.

5 Claims, 7 Drawing Sheets

AMPLIFICATION DEVICE AND AMPLIFICATION METHOD

CROSS-REFERENCE TO RELATED APPLICATION

This application is based upon and claims the benefit of priority of the prior Japanese Patent Application No. 2014-018788, filed on Feb. 3, 2014, the entire contents of which are incorporated herein by reference.

FIELD

The embodiments discussed herein are related to an amplification device and an amplification method.

BACKGROUND

Amplification devices configured to amplify transmission power have heretofore been used in various electronic apparatuses including base stations in a mobile communication system. In particular, with an increase in the speed of telecommunications in recent years, there is a demand for amplifying transmission power with higher efficiency from the viewpoint of saving power consumption and the like. It is known that an amplification device achieves the highest efficiency in a power saturation state (a non-linear state). An amplification device which employs outphasing (hereinafter referred to as an "outphasing amplification device") is proposed as an amplification device adapted to achieve such high efficiency. Examples of a combiner used in the outphasing amplification device include a Chireix combiner. The Chireix combiner has an asymmetrical configuration (transmission line (TL)=90±0 deg, for example) to improve power efficiency characteristics at an output back-off power point.

Such a technique is described, for example, in Japanese Laid-open Patent Publication No. 2007-174148.

SUMMARY

According to an aspect of the invention, an amplification device includes: a first circuit configured to: split an input signal into a first signal and a second signal, and adjust the first signal so that an amplitude of the first signal is less than an amplitude of the second signal by a reduced value, a first amplifier configured to amplify the adjusted first signal, a second amplifier configured to amplify the second signal, and a second circuit configured to: determine a reflection coefficient in case where the amplified second signal is a travelling wave and the amplified first signal is a reflected wave, and determine the reduced value based on the reflection coefficient.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Conventional outphasing amplification devices have a problem of a narrow dynamic range of output power because input impedance of the Chireix combiner viewed from the two amplifiers is asymmetrical due to high output amplitude from the Chireix combiner. Specifically, while such outphasing amplification device amplifies and transmits a radio frequency (RF) signal, reproducibility of a transmission signal depends on the size of the dynamic range and thus a reduction in the dynamic range (by about 20 dB, for example) becomes a factor of reduction in reproducibility of the transmission signal. Such reduction in reproducibility affects improvement in modulation accuracy. Further, since the outphasing amplification device includes two amplifiers located upstream of the Chireix combiner, the reduction in dynamic range and the consequent deterioration in modulation accuracy become particularly noticeable when an input phase difference between the amplifiers is large (that is, when the amplitude after a synthesis is small).

The technique disclosed herein has been made in view of the above-described circumstances and aims to provide an amplification device and an amplification method which are capable of improving modulation accuracy of a transmission signal.

Hereinafter, an embodiment of an amplification device and an amplification method disclosed in this application are described in detail with reference to the drawings. It is to be noted, however, that the amplification device and the amplification method disclosed in this application are not limited to the following embodiment.

Figure 1:
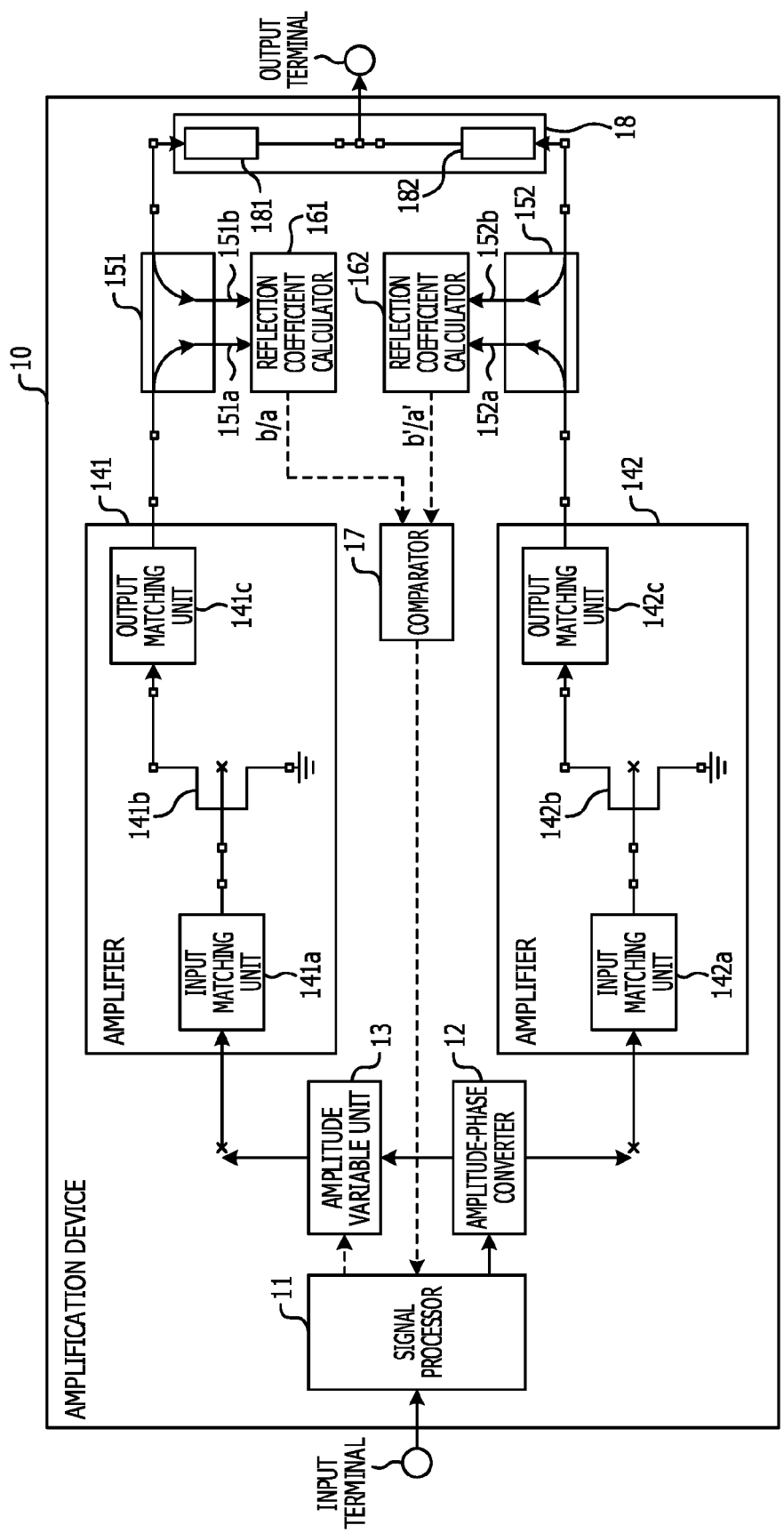
FIG. 1 is a block diagram illustrating a configuration of an amplification device of an embodiment.

First, an amplification device according to an embodiment disclosed in this application is described. FIG. 1 is a block diagram illustrating a configuration of an amplification device 10 of the embodiment. As illustrated in FIG. 1, the amplification device 10 includes a signal processor 11, an amplitude-phase converter 12, an amplitude variable unit 13, amplifiers 141 and 142, directional couplers 151 and 152, reflection coefficient calculators 161 and 162, a comparator 17, and a combiner 18. These constituents are connected such that signals and data can be inputted and outputted unidirectionally or bidirectionally.

The signal processor 11 splits an input signal into two signals each having a certain amplitude value. In addition, the signal processor 11 controls the amplitude variable unit 13 by instructing the amplitude variable unit 13 as to how much amplitude of the input signal (input amplitude) to the amplifier 141 is to be reduced by the amplitude variable unit 13. The signal processor 11 performs waveform shaping, peak processing, and the like of a transmission signal. For example, the signal processor 11 instructs the amplitude variable unit 13 to reduce the input amplitude such that a value c to be described later becomes equal to 1.

The amplitude-phase converter 12 separates the transmission signal into two signals having the same amplitude but different phases, and outputs the signals obtained by the separation to upper and lower systems (a system of the amplifier 141 and a system of the amplifier 142), respectively.

The amplitude variable unit 13 adjusts (reduces, for example) the amplitude of the input signal after the amplitude-phase conversion in accordance with the instruction from the signal processor 11.

The amplifier 141 includes an input matching unit 141a, an amplifier element 141b, and an output matching unit 141c. The input matching unit 141a achieves matching of impedance on an input side of the amplifier element 141b. The amplifier element 141b amplifies the input signal. The output matching unit 141c achieves matching of impedance on an output side of the amplifier element 141b. The amplifier 142 has the same configuration as the amplifier 141. Accordingly, constituents of the amplifier 142 common to those of the amplifier 141 are denoted by reference numerals having the same suffixes and descriptions thereof are omitted. Specifically, an input matching unit 142a, an amplifier element 142b, and an output matching unit 142c of the amplifier 142 correspond to the input matching unit 141a, the amplifier element 141b, and the output matching unit 141c of the amplifier 141, respectively.

The directional coupler 151 outputs an output from the upper system (the amplifier 141) at a predetermined coupling amount (such as 30 dB) from a signal line 151a as a traveling wave, and outputs an output from the lower system (the amplifier 142) from a signal line 151b as a reflected wave. In contrast, the directional coupler 152 outputs the output from the lower system (the amplifier 142) at a predetermined coupling amount (such as 30 dB) from a signal line 152a as a traveling wave, and outputs the output from the upper system (the amplifier 141) from a signal line 152b as a reflected wave.

The reflection coefficient calculator 161 calculates a value by dividing the reflected wave inputted from the directional coupler 151 by the traveling wave inputted from the directional coupler 151, and outputs the calculated value to the comparator 17 as a reflection coefficient b/a. Likewise, the reflection coefficient calculator 162 calculates a value by dividing the reflected wave inputted from the directional coupler 152 by the traveling wave inputted from the directional coupler 152, and outputs the calculated value to the comparator 17 as a reflection coefficient b'/a'.

The comparator 17 outputs a value c (=ab'/a'b), which is obtained by dividing the reflection coefficient b/a inputted from the reflection coefficient calculator 161 by the reflection coefficient b'/a' inputted from the reflection coefficient calculator 162, to the signal processor 11. Here, the value c may be a value calculated by dividing the reflection coefficient b'/a' by the reflection coefficient b/a depending on the configuration of the combiner 18. The signal processor 11 instructs the amplitude variable unit 13 to reduce the input amplitude such that the value c becomes equal to 1.

The combiner 18 performs a vector synthesis of a signal outputted from a TL 181 of the upper system and a signal outputted from a TL 182 of the lower system, and reproduces an amplified transmission signal.

Figure 2:
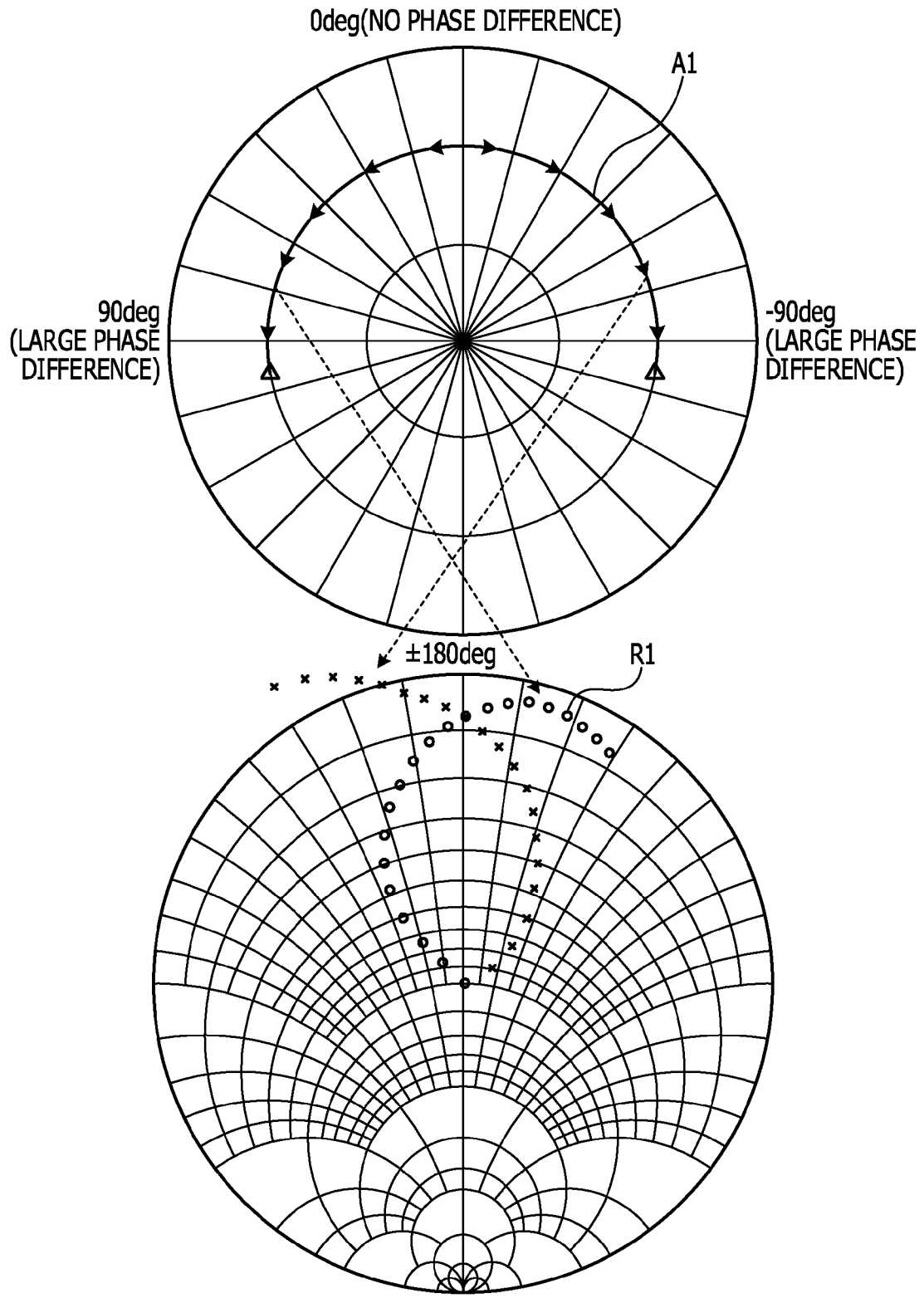
FIG. 2 is a view illustrating loci of reflection coefficients when input amplitude values of amplifiers are equal to each other.

FIG. 2 is a view illustrating loci of reflection coefficients R1 when input amplitude values A1 of the amplifiers 141 and 142 are equal to each other. In FIG. 2, an upper view is a graph in which the amplitude (voltage) A1 of the signal after the amplitude-phase conversion by the amplitude-phase converter 12 and the phase are represented in polar coordinates. A lower view in FIG. 2 is a Smith chart representing the loci of the reflection coefficients R1 (loads) when an input side of the combiner 18 is viewed from output sides of the amplifiers 141 and 142. As illustrated in FIG. 2, the reflection coefficients R1 become unbalanced between the two systems when the inputs of the amplifiers 141 and 142 are of equal amplitude at an arbitrary phase difference (0 to ±90 deg). Specifically, the reflection coefficients R1 become asymmetrical in regions where the phase difference exceeds ±60 deg.

Figure 3:
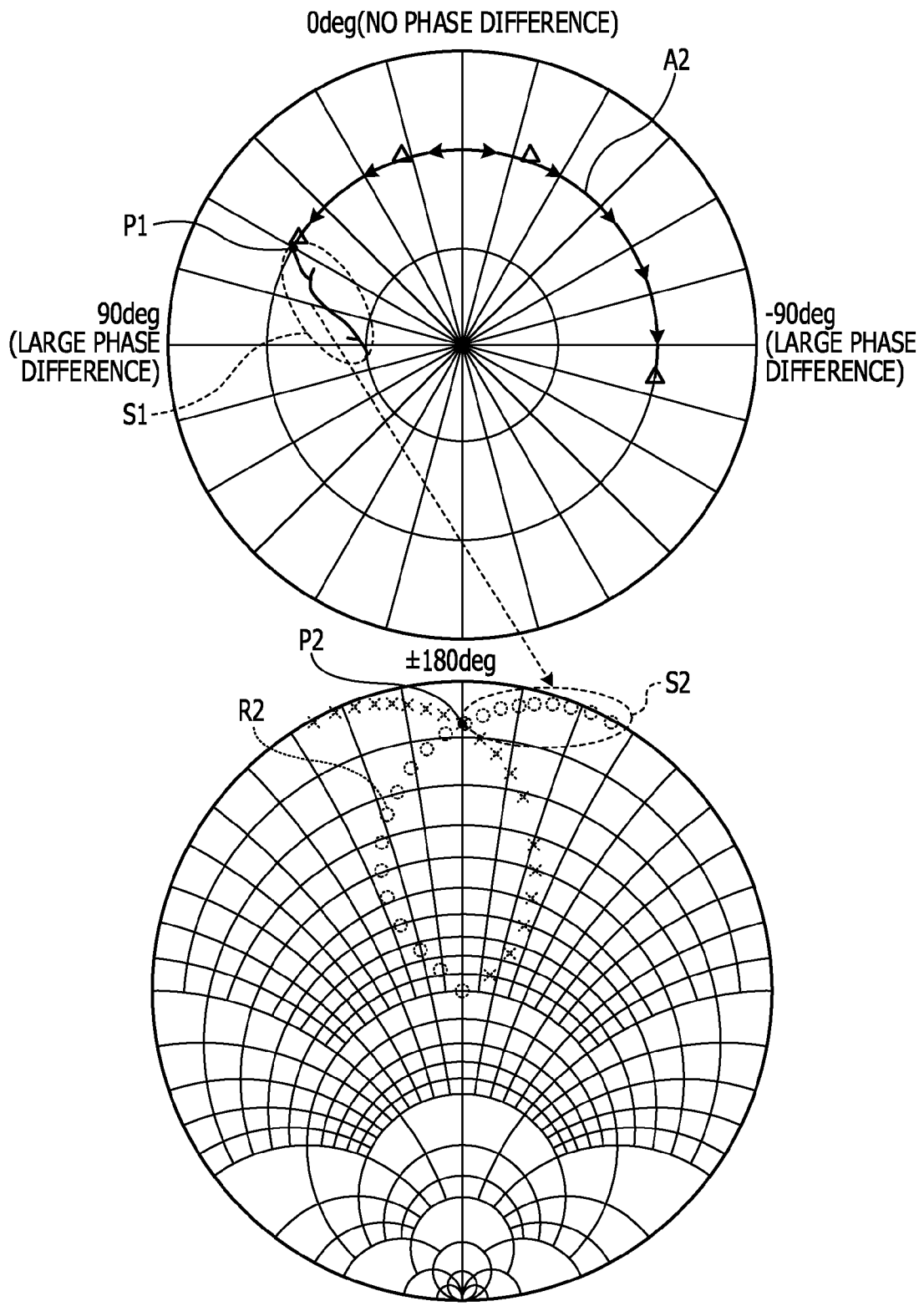
FIG. 3 is a view illustrating loci of reflection coefficients when the input amplitude values of the amplifiers are different from each other.

FIG. 3 is a view illustrating loci of reflection coefficients R2 when input amplitude values A2 of the amplifiers 141 and 142 are different from each other. The amplitude variable unit 13 reduces the amplitude of one of the systems (the system on the amplifier 141 side in FIG. 1) until the reflection coefficients R2 of both of the systems become equal. The amplitude variable unit 13 repeatedly executes this processing for each phase. At this time, the amplitude variable unit 13 controls the input amplitude of the amplifier 141 in accordance with the instruction from the signal processor 11 in a phase difference region S1 or S2 in which the difference is greater than a phase difference P1 or P2 (60 deg in FIG. 3) where the loci of the reflection coefficients cross each other. As a result, amplitude control information indicated with the input amplitude A2 in the phase difference region S1 is obtained, and load impedance of the amplifiers 141 and 142 at that time marks the values indicated as the reflection coefficient R2 therein.

As described above, the amplification device 10 includes the signal processor 11, the amplifier 142, the amplifier 141, the reflection coefficient calculator 162, and the amplitude variable unit 13. The signal processor 11 splits the input signal into a first signal and a second signal. The amplifier 142 amplifies and outputs the first signal. The amplifier 141 amplifies and outputs the second signal. The reflection coefficient calculator 162 calculates the reflection coefficient determined by the output (the traveling wave) from the amplifier 142 and the output (the reflected wave) from the amplifier 141. For example, the reflection coefficient calculator 162 calculates the reflection coefficient when the combiner 18 is viewed from the output from the amplifier 142. The reflection coefficient is determined by the output (the traveling wave) from the amplifier 142 and the output (the reflected wave) from the amplifier 141. This reflection coefficient is, for instance, the reflection coefficient of the output (the reflected wave) from the amplifier 141 relative to the output (the traveling wave) from the amplifier 142. The amplitude variable unit 13 reduces the amplitude of the input signal (the second signal) of the amplifier 141 by using the reflection coefficient calculated by the reflection coefficient calculator 162 and a reference value. Here, in the amplification device 10, the reference value may be the reflection coefficient on the amplifier 141 side. In this case, the amplitude variable unit 13 reduces the amplitude of the input signal of the amplifier 141 such that the reflection coefficient on the amplifier 142 side and the reflection coefficient on the amplifier 141 side become equal to each other.

As described above, when the input phase difference between the amplifiers 141 and 142 is large, the amplification device 10 reduces the input amplitude of only one of the systems such that load impedance values (the reflection coefficients) become balanced between the amplifiers 141 and 142. In this way, output amplitude of the amplification device 10 becomes sufficiently small even when the input phase difference is large, and a dynamic range of the amplification device 10 is expanded accordingly. Thus, reproducibility of the transmission signal is enhanced. As a result, modulation accuracy is improved.

Modified Example

Figure 4:
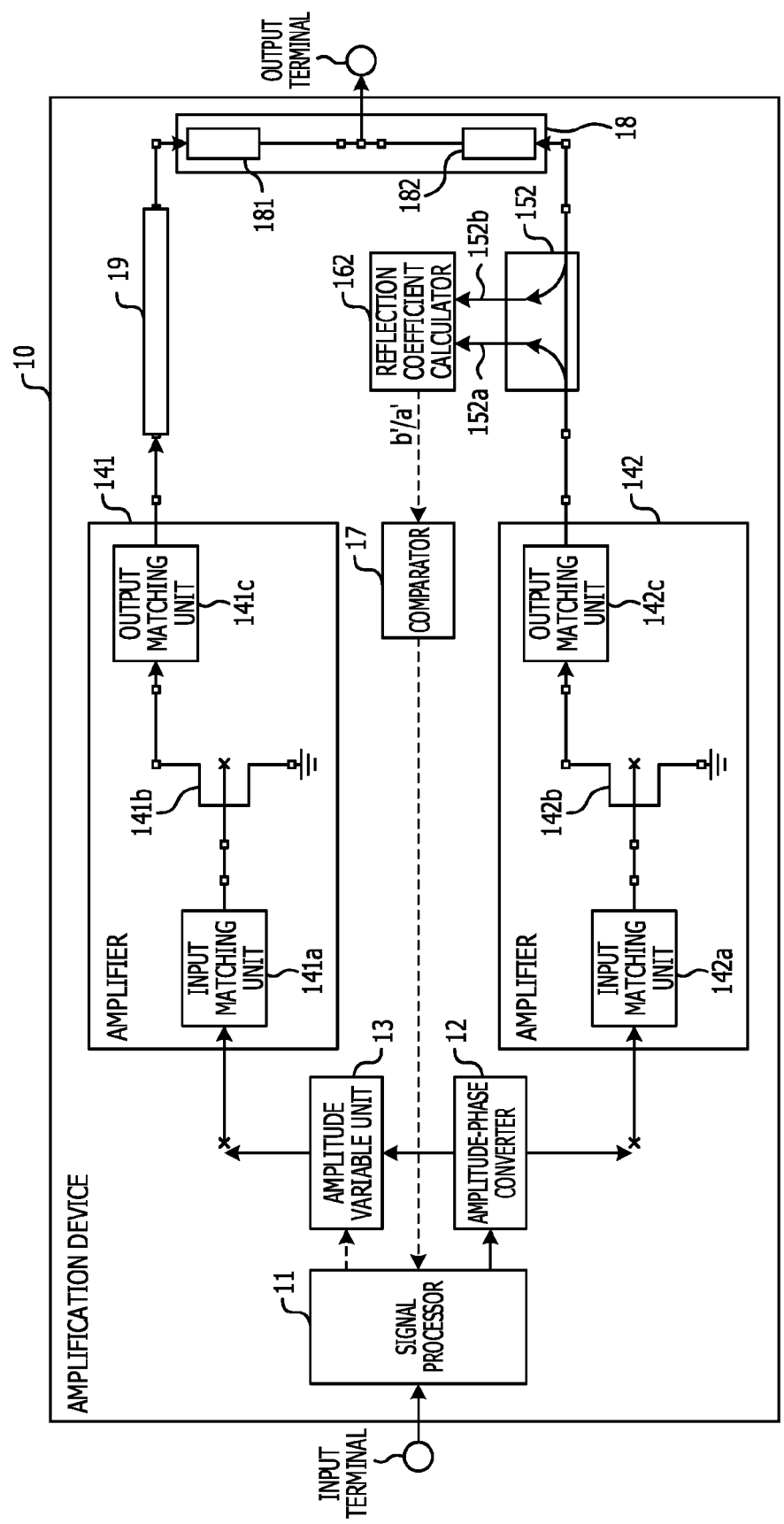
FIG. 4 is a block diagram illustrating a configuration of an amplification device of a modified example.

Next, a modified example is described. FIG. 4 is a block diagram illustrating a configuration of an amplification device 10 of the modified example. As illustrated in FIG. 4, the amplification device 10 of the modified example has the same configuration as the amplification device 10 of the embodiment illustrated in FIG. 1, except that an electrical length line 19 is provided in place of the directional coupler 151. Accordingly, in the modified example, constituents common to those of the embodiment are denoted by the same reference numerals and detailed descriptions thereof are omitted.

Difference between the modified example and the embodiment is the value (hereinafter referred to as a "reference value") to be compared with the reflection coefficient b'/a'. Specifically, in the embodiment, the reference value employs a relative value (the reflection coefficient b/a of the other system), and the amplitude variable unit 13 reduces the input amplitude of the upper system such that the reflection coefficient b'/a' of the lower system and the reflection coefficient b/a of the upper system become equal to each other (at a ratio of 1:1). On the other hand, in the modified example, the reference value is defined as an absolute value (such as a set value below 1), and the amplitude variable unit 13 adopts a method of reducing the input amplitude of the upper system such that the reflection coefficient b'/a' of the lower system becomes below 1, for example. In the following, a configuration and an operation of the amplification device 10 of the modified example are described while mainly focusing on the difference from the embodiment.

In the amplification device 10, the directional coupler 152 and the reflection coefficient calculator 162 are provided only in one of the systems. Meanwhile, the electrical length line 19 having the length equivalent to the directional coupler 152 is inserted into the system on the other side. Here, the aspect in which the directional coupler and the reflection coefficient calculator are provided in the lower system is illustrated in FIG. 4 as an example. However, the directional coupler and the reflection coefficient calculator may be provided in the upper system depending on the design.

The absolute value as the reference value is set to the comparator 17. The signal processor 11 refers to the value set to the comparator 17, and instructs the amplitude variable unit 13 to reduce the input amplitude of the amplifier 141 such that the reflection coefficient b'/a' falls below 1, for example. In accordance with the instruction from the signal processor 11, the amplitude variable unit 13 performs the control to reduce the input amplitude of the one system such that the reflection coefficient b'/a' falls below 1, for example.

Alternatively, the signal processor 11 refers to the value set to the comparator 17, and instructs the amplitude variable unit 13 to reduce the input amplitude of the amplifier 141 such that the reflection coefficient b'/a' becomes equal to a predetermined value, for example. In accordance with the instruction from the signal processor 11, the amplitude variable unit 13 performs the control to reduce the input amplitude of the one system such that the reflection coefficient b'/a' becomes equal t the predetermined value, for example.

Note that the predetermined value is determined in advance at the time of designing or the like. However, the predetermined value might not be a fixed value. The predetermined value may also be a value (a variable value) that varies depending on the phase difference, for example.

As described above, in the amplification device 10, the reference value may be 1, for example. In this case, the amplitude variable unit 13 reduces the amplitude of the input signal of the amplifier 141 such that the reflection coefficient on the amplifier 142 side falls below the predetermined value. The reference value may be a set value at the time of designing, for example. In this case, the amplitude variable unit 13 reduces the amplitude of the input signal of the amplifier 141 such that the reflection coefficient on the amplifier 142 side becomes equal to the predetermined value.

Figure 5:
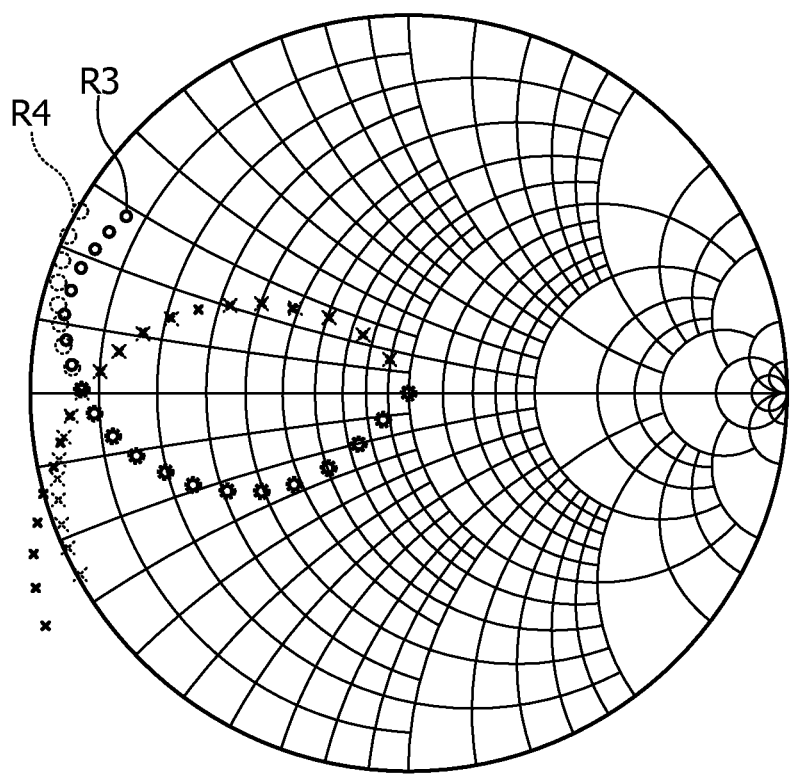
FIG. 5 is a view illustrating aspects of variations in load on the amplifiers caused by the amplification device.

Next, effects of the amplification devices 10 of the embodiment and the modified example are described with reference to FIGS. 5 and 6. FIG. 5 is a view illustrating aspects of variations in load on the amplifiers 141 and 142 caused by the amplification devices 10. As illustrated in FIG. 5, the load impedance of the amplifiers 141 and 142 becomes balanced by the amplitude control by the amplification devices 10. Thus, the dynamic range of the amplification devices 10 subjected to the outphasing control is substantially improved.

Figure 6:
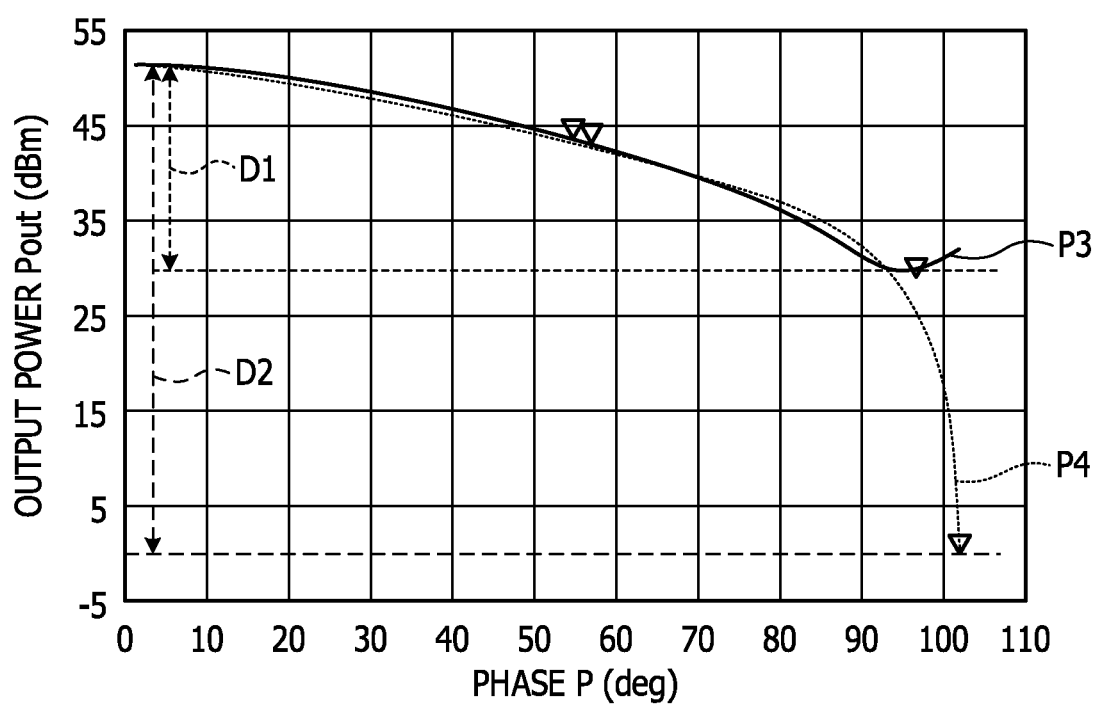
FIG. 6 is a view illustrating an aspect of improvement in dynamic range of output power caused by the amplification device.

FIG. 6 is a view illustrating an aspect of improvement in dynamic range of output power $P_{out}$ by the amplification devices 10. In FIG. 6, the x axis defines a phase P (in the unit of deg) while the y axis defines the output power $P_{out}$ (in the unit of dBm). As illustrated in FIG. 6, while maximum power $P_{max}$ before and after the amplitude control is about 52 dBm in each case, the dynamic range expands from a previous dynamic range D1 (about 20 dB) to a dynamic range D2 (about 50 dB) by the amplitude control by the amplification devices 10. Thus, the reproducibility and the modulation accuracy of the signal to be transmitted by the amplification devices 10 are improved.

Figure 7:
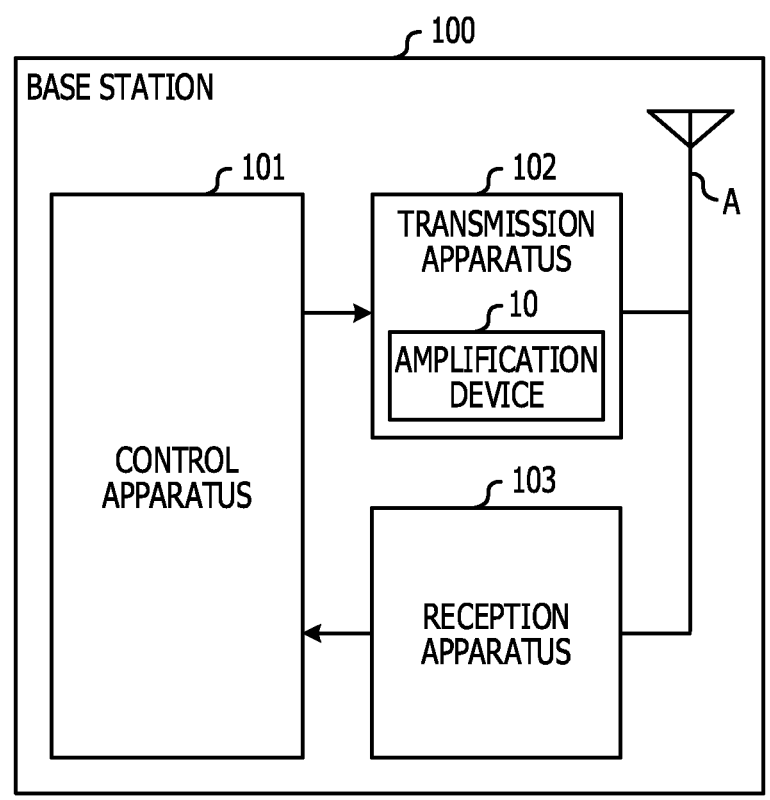
FIG. 7 is a view illustrating an application example of the amplification devices of the embodiment and the modified example.

The amplification devices 10 described in the embodiment and the modified example are applicable to a communication apparatus such as a base station. FIG. 7 is a view illustrating an application example of the amplification devices 10 of the embodiment and the modified example. As illustrated in FIG. 7, a base station 100 includes a control apparatus 101, a transmission apparatus 102, and a reception apparatus 103. The control apparatus 101 outputs a transmission signal to the transmission apparatus 102. The transmission apparatus 102 performs modulation, up-conversion, amplification, and the like on the inputted transmission signal, and transmits the resultant signal via an antenna A. The transmission apparatus 102 includes the above-described amplification device 10, and the amplification device 10 performs the amplification of the transmission signal. The reception apparatus 103 performs predetermined processing on a signal received via the antenna A, and outputs the reception signal after the processing to the control apparatus 101.

While the amplification devices 10 of the embodiment and the modified example are premised on quadrature amplitude modulation (QAM) as a mode for modulating the transmission signal, the amplification devices 10 may apply other amplitude modulation modes.

The reflection coefficient calculators 161 and 162 might not calculate entire parts of the reflection coefficients, but may be configured to calculate only real parts of the reflection coefficients. Likewise, the comparator 17 might not compare the entire parts of the reflection coefficients with the reference value, but may be configured to compare only the real parts thereof with the reference value.

Furthermore, the constituents of each amplification device 10 might not be constructed physically as illustrated in the drawings. In other words, specific aspects of integration or disintegration of the devices are not limited only to the illustrated examples. All or part of the devices may be integrated or disintegrated physically or functionally in any arbitrary units depending on various loads, conditions of use, and the like. For example, the signal processor 11 and the comparator 17 may be integrated into one constituent, or the reflection coefficient calculators 161 and 162 and the comparator 17 may be integrated into one constituent. On the other hand, the signal processor 11 may be disintegrated into a part configured to split the input signal into two signals respectively having the predetermined amplitude values, and a part configured to give an instruction of reducing the input amplitude of the amplifier 141. The latter instruction part may further be disintegrated into a portion configured to perform the instruction to cause the ratio between the reflection coefficients of the two systems to become equal to a predetermined value, and a portion configured to perform the instruction to cause the reflection coefficient of the amplifier 142 to become equal to a predetermined value.

The example of hardware of each amplification device 10 is as follows. A signal processor 11 may be achieved by a processor and a memory. The processor may include, for example, at least one of Central Processing Unit (CPU), Digital Signal Processor (DSP), Large Scale Integration (LSI), Field-Programmable Gate Array (FPGA), Application Specific Integrated Circuit (ASIC), and so on, which are digital circuits. The memory may include, for example, at least one of Read Only Memory (ROM), Random Access Memory (RAM), and so on, which are digital circuits. An amplitude-phase converter 12 may be achieved by the processor and the memory. Otherwise, the amplitude-phase converter 12 may be achieved by an analog circuit. An amplitude variable unit 13 may be achieved by the processor and the memory. Otherwise, the amplitude variable unit 13 may be achieved by an analog circuit. Amplifiers 141 and 142 may be achieved by an analog circuit (e.g. a transistor) respectively. Directional couplers 151 and 152 may be achieved by an analog circuit. Reflection coefficient calculators 161 and 162 may be achieved by the processor, the memory, and an analog circuit (e.g. an A/D converter and a D/A converter). A comparator 17 may be achieved by the processor, the memory, and an analog circuit (e.g. A/D converter). A combiner 18 may be achieved by an analog circuit. One or more D/A converter may be inserted between some elements in the FIG. 4, although it is not illustrated in the figure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An amplification device comprising:
a first circuit configured to:
split an input signal into a first signal and a second signal, and
adjust the first signal so that an amplitude of the first signal is less than an amplitude of the second signal by a reduced value;
a first amplifier configured to amplify the adjusted first signal;
a second amplifier configured to amplify the second signal; and
a second circuit configured to:
determine a reflection coefficient when the amplified second signal is a travelling wave and the amplified first signal is a reflected wave,
determine another reflection coefficient when the amplified first signal is a travelling wave and the amplified second signal is a reflected wave, and
determine the reduced value based on at least the reflection coefficient.

2. The amplification device according to claim 1, wherein the determined reduced value is further determined based on the reflection coefficient and the other reflection coefficient being substantially same.

3. The amplification device according to claim 1, wherein the determined reduced value is further determined based on the reflection coefficient being less than a specified value.

4. The amplification device according to claim 1, wherein the determined reduced value is further determined based on the reflection coefficient and a specified value being substantially same.

5. An amplification method comprising:
splitting an input signal into a first signal and a second signal;
adjusting the first signal so that an amplitude of the first signal is less than an amplitude of the second signal by a reduced value;
amplifying the adjusted first signal;
amplifying the second signal;
determining a reflection coefficient when the amplified second signal is a travelling wave and the amplified first signal is a reflected wave;
determining another reflection coefficient when the amplified first signal is a travelling wave and the amplified second signal is a reflected wave; and
determining the reduced value based on at least the reflection coefficient.

* * * * *